United States Patent [19]

Bowker

[11] Patent Number: 4,687,543

[45] Date of Patent: Aug. 18, 1987

[54] SELECTIVE PLASMA ETCHING DURING FORMATION OF INTEGRATED CIRCUITRY

[75] Inventor: Christopher D. Bowker, San Jose, Calif.

[73] Assignee: Tegal Corporation, Novato, Calif.

[21] Appl. No.: 832,047

[22] Filed: Feb. 21, 1986

[51] Int. Cl.$^4$ .......................... B44C 1/22; C03C 15/00; C03C 25/06

[52] U.S. Cl. .................................... 156/643; 156/646; 156/651; 156/653; 156/657; 156/659.1; 204/192.32; 252/79.1

[58] Field of Search ............ 204/164, 192 EC, 192 E; 427/38, 39; 252/79.1; 156/643, 646, 651, 653, 657, 659.1, 662

[56] References Cited

U.S. PATENT DOCUMENTS 4,418,094 11/1983 See et al. ................................ 427/38
4,455,193 6/1984 Jeuch et al. .......................... 156/643
4,465,552 8/1984 Bobbio et al. ....................... 156/643
4,501,061 2/1985 Wonnacott ............................ 29/591
4,601,782 7/1986 Bianchi et al. ...................... 156/643

OTHER PUBLICATIONS

Whitcomb, Selective, Anisotropic Etching of $SiO_2$ and PSG in a $CHF_3/SF_6$, RIE Plasma, Conference: Electrochemical Society Incorporated, Spring Meeting, May 9–14, 1982, Abstract No. 211, pp. 339–340.

Primary Examiner—William A. Powell
Attorney, Agent, or Firm—Paul F. Wille

[57] ABSTRACT

A method is disclosed for removing (etching) an insulating layer form an electrically semiconductive material wherein a volatile fluoride is substituted for a hydrocarbon in gases for selective plasma discharges. The removing is done without polymer build-up and loss of selectivity.

7 Claims, 5 Drawing Figures

SELECTIVE PLASMA ETCHING DURING FORMATION OF INTEGRATED CIRCUITRY

BACKGROUND OF THE INVENTION

The present invention relates to the manufacture of integrated circuitry and, more particularly, to a method of selectively etching an insulating layer, such as a layer of silicon dioxide, with a plasma discharge.

Integrated circuitry is typically manufactured by forming a multiple number of the desired circuits on a semiconductive substrate, called a wafer. The wafer is then cut-up (diced) to provide the individual circuits. It is common during the manufacture, to use etching to remove selected portions of one material from another. For example, an insulating layer, such as a layer of silicon dioxide, is often applied to a whole surface of an electrically conductive or semiconductive material (the wafer substrate or a layer of material applied earlier in the processing operation). A portion of the insulating layer is then removed to provide a desired insulating layer configuration. This portion typically is removed by masking with, for example, photoresist, that portion which is *not* to be removed while maintaining exposed the portion to be removed. The exposed portion is then removed by subjecting the whole insulating layer and material therebeneath to an etching process.

There are several different etching processes, the selection of the one to be used in any particular situation being dependent upon several factors, including the operation stage, the material to be removed, the underlying material, availability for particular manufacturing processes, etc. One of such types is so-called plasma etching. In plasma etching, the exposed portion of the material to be removed is subjected to a plasma discharge of a gas selected to etch away the material it is desired be removed.

It is often quite important that the material to be etched or removed by plasma etching, be removed without damage to the underlying material. As a practical matter, etching will not be completed for all parts of a wafer containing integrated circuitry at the same time. The result is that there will be portions of the underlying material which will be subjected to the etching plasma before complete etching over the full wafer surface, of the material desired to be removed. Thus, in order to prevent damage to the underlying material, it is important that the plasma etching process be "selective", i.e., will continue to etch or remove the material desired to be removed without causing significant damage to any exposed portion of the material that is not to be removed.

Because of the problem of potential damage to an underlying material, some plasma etching is effected as a two stage operation. That is, the masked body to be subjected to plasma etching is subjected to a first plasma discharge of a gas which is designed to provide the majority of the desired etching. However, it is not necessary that such gas be selective, i.e., not deleteriously etch the underlying material, since little, if any, of such material will be exposed to the discharge. A second stage of plasma etching is then used. This stage must provide the selective etching, since it is during such stage that portions of the underlying material will be exposed.

It has been found that the use of a fluorocarbon as the active ingredient in a plasma discharge provides etching with the desired selectivity when the material to be removed is an insulating layer such as silicon oxide and the underlying layer is an electrically conductive or semiconductive material, such as monocrystalline or polycrystalline silicon. Typical fluorocarbons used are carbon tetrafluoride ($CF_4$); hexafluoroethane ($C_2F_6$); and octofluoropropane ($C_3F_8$). Such a gas is a source of fluorine ions for the discharge-fluorine ions being quite reactive and providing a good etch rate. Such a gas is also a good source of the carbon believed to be necessary to cause the polymerization as discussed below thought to be responsible for good selectivity. In view of the necessity of such etching selectivity, the actual gas selection for a particular process is made with a view toward reducing the fluorine to carbon ratio. Care mut be taken, though, to provide a desired selectivity and yet avoid gross polymerization. Hydrogen is often added to the gas in small amounts to combine with the fluorine that is liberated and thereby reduce the amount of free fluorine in the plasma. Sometimes another fluorocarbon, such as $CHF_3$, is provided as the source of hydrogen. An inert cooling or carrier gas, such as helium also is typically included.

With fluorocarbon chemistry, it is believed that etching of the underlying material by fluorine ions is inhibited by passivating the surface of such material with a polymer. Whether or not this is the phenomenon, it is known that a polymer (polytetrafluoroethylene) is formed by the plasma discharge of a fluorocarbon gas. The difficulty is that this polymer coats the exposed areas of the plasma chamber, i.e., the process chamber used to contain the plasma discharge. Such coating is quite dramatic. Even if care is taken to assure that gross polymerization rather than etching does not occur, the plasma chamber typically will be rendered useless by polymer coating, after processing of only a small number of integrated circuit wafers. The processing then must be stopped while the chamber is cleaned. This significantly affects material flow rate.

SUMMARY OF THE INVENTION

The present invention provides desired selectivity in plasma etching without undesired polymer coating of the plasma chamber. It has been discovered that the non-carbon containing source of volatile fluorine ions, sulphur hexafluoride, can be substituted for the active fluorocarbon chemistry typically used in plasma etching, without loss of selectivity. It should be noted that by the term "volatile" is meant an element or compound which is gaseous at the temperature of the plasma discharge. Sulphur hexafluoride is commonly used in integrated circuit processing, primarily to etch silicon. It was quite surprising to learn that such a gas could be used to provide selective etching of an insulating layer from an underlying material which could be silicon. To provide such selectivity, the non-carbon containing source is combined with a fluorocarbon which typically only has been added to an etching mixture to provide hydrogen, e.g., fluoroform ($CHF_3$).

The chemistry of the resulting plasma discharge providing the selective etching without polymer build-up, is not entirely understood. It is postulated that there is sufficient polymer formed by the fluoroform to coat the underlying silicon surface to inhibit etching. This polymer most likely is in dynamic equilibrium (constantly being formed and etched away) at the surface so as to inhibit such etching, but not being of such significance within the plasma to coat the plasma chamber. The presence of the fluoroform has the added advantage of providing carbon to combine with oxygen to form carbon monoxide for end point detection.

Most desirably, the flow ratio of the fluorocarbon gas to the non-carbon containing source of volatile fluorine or chlorine ions is between about 30% and 65%. While from the broad standpoint any non-carbon containing source of volatile fluorine or chlorine ions can be used in the plasma, only certain fluorides are useful as a practical matter in view of corrosion and toxicity problems, etc. Other fluorides which can be a source in such a plasma of volatile fluorine atoms are nitrogen fluoride, boron fluoride, sulphur tetrafluoride, and sulfuryl fluoride. When sulphur hexafluoride ($SF_6$) is used and the fluorocarbon is fluoroform, the flow ratio of the fluoroform to the sulphur hexafluoride is between about 35% and 50%. (By "flow ratio" is meant the ratio of the flow rates of the gases into the plasma chamber.)

The insulating layer with which the process has been usefully employed is silicon dioxide, although it is believed that it will work just as well for silicon nitride. Moreover, typically the material of the body which is covered with the insulating layer will be doped or undoped monocrystalline or polysilicon.

As mentioned previously, plasma etching sometimes is done in two stages, a first one in which gross etching is obtained without significant concern for selective etching. That is, during this first stage little or no portion of the material underlying the layer to be etched will be exposed, so that the problem of potentially damaging the underlying material is not present. It is during the second stage of etching that selective etching is important and, hence, to which the present invention is particularly applicable. It has been found, however, that sulphur hexafluoride can itself provide etching in the first stage under high pressure and high power conditions. While it is not necessary that a fluorocarbon also be a component of the plasma discharge gas during the first stage, it is desirable, in that it does improve uniformity and some increase in the etch rate.

Other features of the invention will be described or will become apparent from the following more detailed description.

BRIEF DESCRIPTION OF THE DRAWINGS

With reference to the accompanying four sheets of drawing.

DETAILED DESCRIPTION OF THE PREFERRED EMBODIMENT

Figure 1:
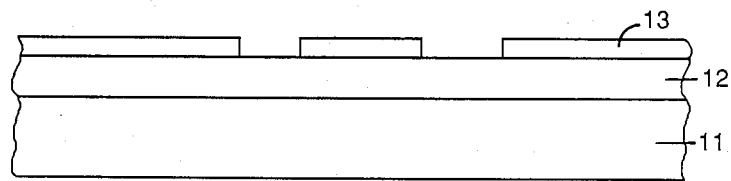
FIGS. 1 and 2 are idealized, greatly enlarged, schematic views of a portion of an integrated circuit before and after being subjected to a plasma etching in accordance with the invention.
Figure 2:
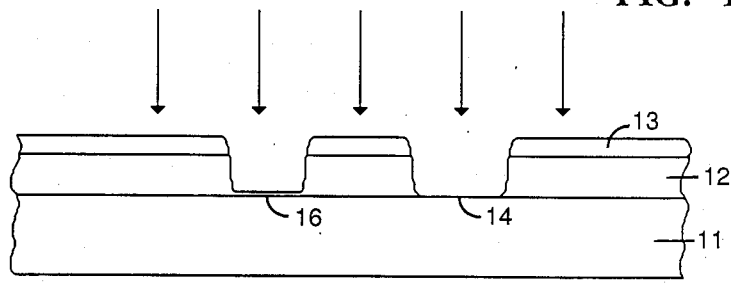

As mentioned previously, the broad concept of the invention is based on the discovery that a volatile fluoride can be substituted for a hydrocarbon provided in gases for selective plasma discharges, to remove an insulating layer from an electrically semiconductive material. The combination of such volatile fluoride with a hydrocarbon normally provided as part of such a gas to furnish hydrogen, results in desired selective etching. Reference is made to FIGS. 1 and 2 for a basic description of selective plasma etching. With reference to such figures, an electrically conductive or semiconductive body of material is generally represented at 11. Such body could be, for example, a doped, monocrystalline silicon wafer substrate or a polysilicon layer which has been applied thereto during integrated circuit fabrication. An insulating layer applied to the full surface thereof is represented at 12. Such layer could be, for example, silicon dioxide, an insulating material for which the invention has been found to be particularly applicable. It is applied to the surface of the underlying body 11 by any well-known technique.

In general, it is not desired in the final product that the insulating layer 12 cover the full surface of the material 11. Thus, before additional material is applied to the integrated circuit sandwich, portions of the insulating layer are removed. This is achieved by masking (covering) those portions not to be removed while maintaining the portion or portions to be removed, exposed. Typically this is achieved by applying a mask, such as a photoresist applied by a photolithographic process, which is a negative of the desired configuration, i.e., it includes an open configuration defining the areas of the insulating layer to be removed. Such a mask is represented in the figures by the reference numeral 13 and is applied to the exposed surface of the insulating layer.

The masked product is then subjected to an etching process to remove the insulating material from those portions of the underlying body 11 which are to be exposed. As mentioned previously, there are various types of etching processes. The instant invention is particularly applicable to plasma etching. As brought out earlier, in some plasma etching two separate, sequential plasma discharges are utilized. The first discharge need not be selective with respect to the underlying material and the material of the insulating layer. That is, it simply must be capable of providing a relatively rapid etching of the insulating layer.

While body 11 will be covered during such initial plasma discharge, it will be recognized that the masking layer 13 will be exposed to the plasma, along with the exposed portions of the insulating layer. The gas of such first plasma must be selected relative to the materials of the mask and insulating layer to provide selective etching of the insulating layer. In many situations, however, slight etching of the mask is acceptable.

It is during the second plasma discharge that care must be taken to assure that the plasma selectively etches the insulating layer. As mentioned previously, it is common for the insulating layer to be entirely removed at one location while other locations may require further etching. These locations could, of course, be immediately adjacent one another at a single exposed area. However, for explanatory purposes the two separate exposed areas in FIG. 2 are illustrated with the insulating layer at one area, area 14, being completely removed while at the same time the insulating layer at a second exposed area, area 16, includes insulating material which still must be etched from the body 11. It is because of this phenomenon that the plasma discharge must be selective, i.e., etch the insulating layer in preference to etching of the exposed portion of the body 11. This selectivity typically is provided by assuring that the rate of etching for the material of the insulating layer is significantly higher than the rate of etching of the underlying material. The etching process then can be discontinued before any significant damage to the body 11 is caused.

As also mentioned previously, this selective etching commonly is achieved with a volatile fluorocarbon gas, such as carbon tetrafluoride, as the active agent. Such a gas will provide fluorine to form ions to cause etching of the insulating layer and also provide the carbon believed to be necessary to cause polymerization at the exposed portion of the body 11 and, hence, inhibit etching of the same.

The instant invention is based on the discovery that sulphur hexafluoride, a non-carbon containing source of volatile fluorine ions, can be substituted in a plasma discharge gas for the fluorocarbon typically utilized in the same to cause both etching and selectivity. The combination in a plasma discharge gas of such a source of volatile fluorine or chlorine ions with a fluorocarbon which typically has been provided in the past simply to be a source of hydrogen, provides etching of the insulating layer while providing the desired selectivity.

The selective etching phenomenon is particularly surprising since sulphur hexafluoride by itself is known to provide good etching of silicon. In this connection, attention is directed to U.S. Pat. No. 3,679,502 issued July 25, 1972. Moreover, although it has been proposed that Freon 12 ($CCL_2F_2$) be added to a mixture of sulphur hexafluoride and oxygen forming a polysilicon etching plasma for end point indication (see U.S. Pat. No. 4,447,290), the combination of a fluorocarbon with a non-carbon containing source of volatile fluorine or chlorine ions to selectively etch an insulating layer from a conductive or semiconductive material, such as a polysilicon has not be proposed.

Figure 3:
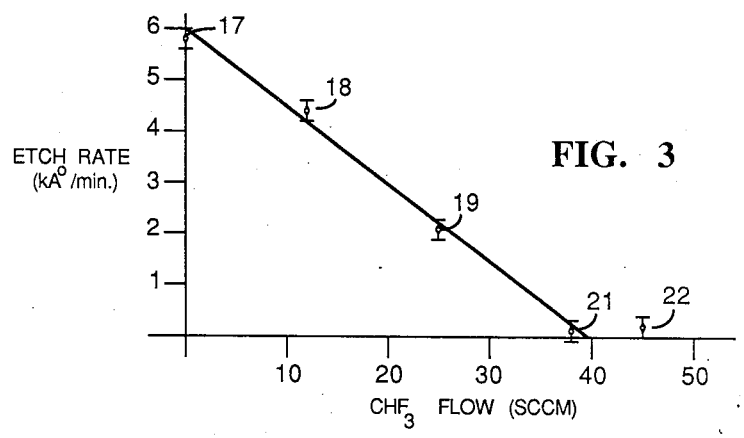
FIG. 3 is a graphical showing of the relationship of etching by a plasma containing a dominant portion of sulphur hexafluoride to the amount of a fluorocarbon contained within the same.

FIG. 3 is a graphical representation of the effect of the presence of the fluorocarbon fluoroform on the etch rate of polysilicon by sulphur hexafluoride. The tests responsible for the values in such figure were run on the single wafer in-line oxide etcher available from Tegal Corporation, Novato, Calif., as Model 803. The temperature of operation of the plasma chamber is room temperature for all examples discussed herein. The power and pressure is adjusted depending upon the specific gases that are used and the materials to be exposed to the plasma.

The plasma discharge in the chamber was maintained with a power of 200 watts at a pressure of 2.50 torr. The gas provided to the plasma chamber for the plasma discharge had a constant flow rate of sulphur hexafluoride of 48 cubic centimeters per minute (SCCm) and a constant flow rate of a carrier helium gas of 100 SCCm. The flow rate of fluoroform was varied and the resulting etch rate of polysilicon measured. As indicated on the graph, when the flow rate of fluoroform was 0 the poly etch rate was approximately 5750 angstroms per minute with a standard deviation (three sigma values) of plus or minus 222 angstroms. This is represented in FIG. 3 by the point 17. When the flow rate was increased to 12.5 cubic centimeters per minute, the etch rate of the polysilicon decreased to 4391 angstroms per minute plus or minus 197. Point 18 in the graph illustrates such etch rate. When the flow rate of the fluoroform was increased to 25 cubic centimeters per minute, the etch rate decreased to 2044 angstroms, again with a standard deviation of plus or minus 171. This is represented in FIG. 3 by point 19. When the flow rate of fluoroform was increased to 38.5 cubic centimeters per minute, the polysilicon etch rate decreased to 82 angstroms per minute with a potential error deviation of plus or minus 28. Point 21 in FIG. 3 represents such reading. Continued increase in the flow rate of the fluoroform illustrated that above a flow rate of about 38.5, essentially no polysilicon etching takes place. At a flow rate of 45 cubic centimeters per minute, the etch rate is approximately 116 plus or minus 104. Point 22 in the graph represents such measurement.

Figure 4:
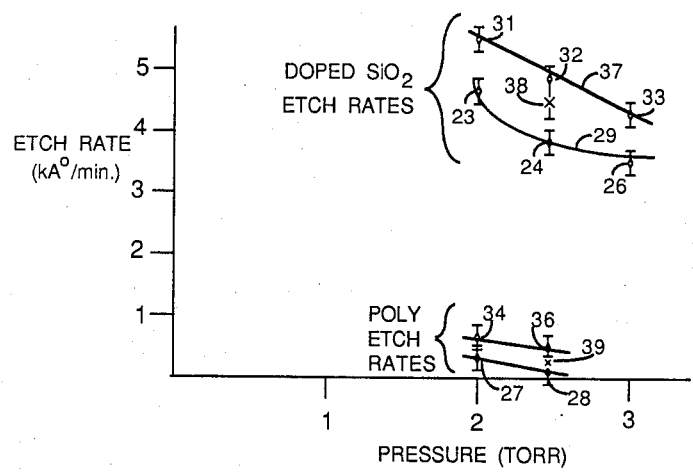
FIG. 4 is a graphical representation of the selective etch rates of three different proportions of gas.

FIG. 4 graphically illustrates the selectivity provided by the combination of gases in differing proportions. That is, it illustrates a comparison of the etch rate of doped silicon oxide (an insulating layer) to polysilicon, for various flow rate combinations at different pressures. These selectivity tests were done on standard doped Tylan polysilicon with Kodak 820 positive resist, and ran on the Tegal 803 oxide etcher. The power was maintained constant at 200 watts for all of such testing and the constituent gas included a constant supply of helium at 100 cubic centimeters per minute.

The dots 23–26 and 27–28 in FIG. 4 represent readings obtained with a flow rate of sulphur hexafluoride of 48 cubic centimeters per minute and of fluoroform at 38 cubic centimeters per minute. When the total pressure of the gas added to the plasma chamber was 2 torr, the etch rate of the doped silicon dioxide was 4700 angstroms per minute, plus or minus 100, as represented by point 23, whereas the etch rate of polysilicon at such pressure as represented by point 27 equalled 275 angstroms per minute, plus or minus 100. When the pressure of gas flowing in the plasma chamber was increased to 2.5 torr, the etch rate of the doped silicon oxide dropped to 3800 angstroms per minute with a standard deviation of plus or minus 175. Point 24 on the graph represents such reading. The etch rate of polysilicon at the same pressure was approximately 80 angstroms plus or minus 20. This is represented in the graph by point 28.

When the pressure was increased to 3 torr, the etch rate of doped silicon dioxide became 3610 angstroms, plus or minus a standard deviation of 150. This is represented at 26. There was at the same time essentially no etching of polysilicon. The selectivity provided by the above at 3 torr was approximately 50:1. This selectivity is quite adequate. The line 29 connecting the points 23 through 26 represents, in essence, the selectivity achievable at various pressures with a 3 to 1 relationship between the fluoroform and sulphur hexafluoride.

The flow rate of fluoroform was decreased to 25 cubic centimeters per minute whereas the flow rate of sulphur hexafluoride was retained at 48 cubic centimeters per minute, with the result that the flow ratio of sulphur hexafluoride to fluoroform became approximately 2 to 1. Etch rate at various pressures were then measured, which etch rates are represented in FIG. 4 by the circles 31–33 and 34–36. At a pressure of 2 torr it was found that 5109 angstroms per minute plus or minus 40 of doped silicon dioxide was removed. Circle 31 represents this reading. At this same pressure, the measured etch rate of polysilicon was 650 angstroms, plus or minus 100. This is represented by circle 34.

When the pressure was increased to 2.5 torr, the etch rate of doped silicon dioxide became 4800 angstroms per minute, plus or minus 100. Circle 32 represents this reading. At the same pressure, the etch rate of polysilicon was 500 angstroms per minute. This reading is represented in FIG. 4 by circle 36. When the pressure is increased to 3 torr, the etch rate of doped silicon became 4350 angstroms per minute, plus or minus 200. The selectivity at 2.5 torr for such proportion of gases was approximately 10:1. This selectivity is adequate.

The proportion of sulphur hexafluoride to fluoroform represented by the readings responsible for the line 37 extending between circles 31 and 33 and the line 29, represents the preferred range of proportions to obtain the desired selectivity. A preferred proportion within this range is represented by the readings indicated by "X's" 38 and 39 in the graph. Such X's represent the readings obtained when the flow rate of fluoroform is 30 cubic centimeters per minute, whereas the flow rate of sulphur hexafluoride is 48 cubic centimeters per minute. At a pressure of 2.5 torr, the doped silicon dioxide layer is etched at a rate of 4650 plus or minus 75 angstroms per minute as represented by X 38, whereas polysilicon is etched at a rate of 123 plus or minus 84 angstroms per minute as represented by X 39. (It will be recognized that when the insulating layer is a thermal oxide, the selectivity will be lower.)

Figure 5:
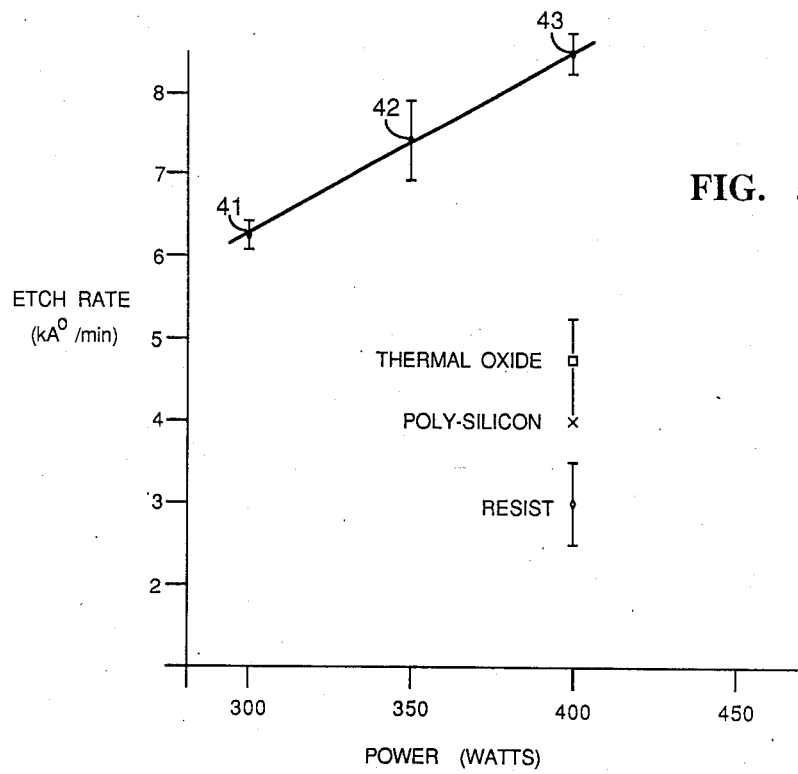
FIG. 5 is a graphical representation of the etching obtained in the first stage plasma discharge of an insulating layer, when the active gas within the plasma is sulphur hexafluoride.

As mentioned previously, plasma etching of an insulating layer typically is obtained by subjecting the mask body to two sequential plasma discharges. It is the second one of such discharges in which the underlying material may be exposed and selectivity is quite important. As also mentioned previously, however, it has been found that a plasma gas having as an active ingredient, a non-carbon containing source of volatile fluorine atoms is capable of providing the desired etching under high pressure and power conditions. FIG. 5 graphically presents readings which have been obtained using such a source. The low temperature oxide wafers utilized in the tests are Thermco wafers (V/I is equal to 1.8–2.3 ohms, 8.0–8.8 percent P) masked with Kodak 820 positive resist and a 58049A contact mask. Again etch rates were measured on the Tegal 803 oxide etcher. The source is again sulphur hexafluoride and its flow rate into the plasma chamber is 190 standard cubic centimeters per minute with a flow rate of helium of 100 standard cubic centimeters per minute.

It is desirable that the plasma gas of the first discharge also include a fluorocarbon to improve uniformity and to increase the etch rate to some extent. In this connection, it is preferred that the ratio of fluoroform to sulphur hexafluoride of the gas for this first plasma discharge be in the range of 5% to 15%. To this end, 10 standard cubic centimeters per minute of fluoroform also was added as a constituent to the gas.

The points 41–43 represent the etch rate of doped low temperature oxide at various power levels when it is subjected to such gas. The etch rate of polysilicon, a thermal silicon dioxide and the photoresist are also illustrated. While the fluorocarbon included in all the above examples is fluoroform, it is believed that methane ($CH_4$) will act equally as well as a fluorocarbon additive.

It will be appreciated that although the invention is described in connection with preferred embodiments thereof, it will be appreciated that various modifications and variations are possible and that it is intended that the coverage afforded applicant be limited only by the language of the claims and its equivalents.

What is claimed is:

1. A method for selectively etching an insulating layer overlying a body of material including silicon comprising the steps of:
    subjecting said layer to a plasma discharge in a gas mixture containing sulfur hexafluoride and a fluorocarbon wherein the flow rate of said sulphur hexafluoride is approximately equal to or greater than the flow rate of said fluorocarbon.

2. The method of claim 1 wherein said fluorocarbon is fluoroform.

3. The method of claim 1 wherein the material of said insulating layer is selected from the group consisting of silicon nitride and silicon dioxide.

4. The method of claim 1 wherein the material of said insulating layer is silicon dioxide.

5. The method of claim 1 wherein said material of said body is silicon.

6. The method as set forth in claim 1 and further comprising as an additional step:
    subjecting said material to a plasma discharge in a gas mixture containing sulphur hexafluoride and a fluorocarbon.

7. The method as set forth in claim 6 wherein said additional step comprises:
    subjecting said material to a plasma in a gas mixture wherein the fluorocarbon comprises fluoroform.

* * * * *